United States Patent [19]

Tanabe et al.

[11] Patent Number: 4,883,920
[45] Date of Patent: Nov. 28, 1989

[54] CHIP TYPE COMPONENT INSTALLATION STRUCTURE

[75] Inventors: Takeshi Tanabe; Toshio Hori, both of Nagaokakyo, Japan

[73] Assignee: Murata Manufacturing Co., Ltd., Kyoto, Japan

[21] Appl. No.: 200,374

[22] Filed: May 31, 1988

[30] Foreign Application Priority Data

Jun. 2, 1987 [JP] Japan .................. 62-138612

[51] Int. Cl.⁴ .................................................. H05K 01/18
[52] U.S. Cl. .................. 174/68.5; 228/180.1; 228/180.2; 361/406; 361/409
[58] Field of Search .......... 361/404, 406, 411, 409; 174/68.5; 228/180.1, 180.2, 215

[56] References Cited

U.S. PATENT DOCUMENTS

| | | | |
|---|---|---|---|
| 3,429,040 | 2/1969 | Miller | 228/215 X |
| 3,610,811 | 10/1971 | O'Keefe | 361/411 X |
| 3,833,838 | 9/1974 | Christiansen | 174/68.5 X |
| 3,851,223 | 11/1974 | Yonezuka et al. | 174/68.5 X |
| 3,859,722 | 1/1975 | Kinsky et al. | 174/68.5 X |
| 3,887,760 | 6/1975 | Krieger | 361/411 X |
| 4,088,828 | 5/1978 | Yamamotot et al. | 174/68.5 |
| 4,139,881 | 2/1979 | Shimizu et al. | 361/406 X |
| 4,164,778 | 8/1979 | Sawairi et al. | 361/411 X |
| 4,413,309 | 11/1983 | Takahashi et al. | 361/406 |
| 4,605,987 | 8/1986 | Allensworth | 361/406 X |
| 4,694,121 | 9/1987 | Ota | 174/68.5 |
| 4,747,109 | 5/1988 | Ito et al. | 29/840 X |
| 4,766,268 | 8/1988 | Uggowitzer | 174/68.5 |
| 4,767,892 | 8/1988 | Kobari | 174/68.5 |
| 4,779,339 | 10/1988 | Ohtani et al. | 174/68.5 X |
| 4,803,308 | 2/1989 | Taguchi | 174/68.5 |

*Primary Examiner*—R. R. Kucia
*Attorney, Agent, or Firm*—Wenderoth, Lind & Ponack

[57] ABSTRACT

In the chip type component installation structure wherein chips are arranged to be joined by solder to a fitting pattern provided on a printed substrate, resist films are set separately in the space of the fitting pattern in order to reduce the quantity of solder. The resist films are set in the space of the fitting pattern separately, so that the structure provides a lesser quantity of solder to join and fix chips, a continuous solder band over the fitting pattern, and a lesser but sufficient quantity of the solder. The structure prevents cracks and breakages of chips due to the expansion and contraction of solder, increases the polarity of solder against chips and electrodes, shortens the soldering time, and increases the reliability of chip installation work.

6 Claims, 3 Drawing Sheets

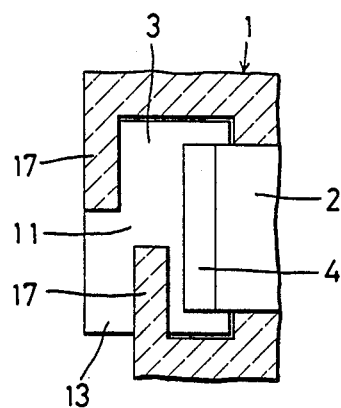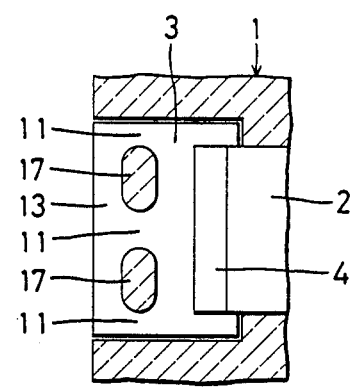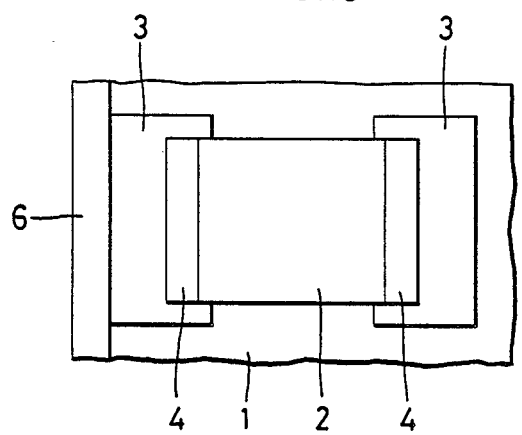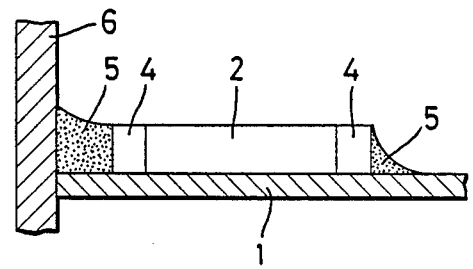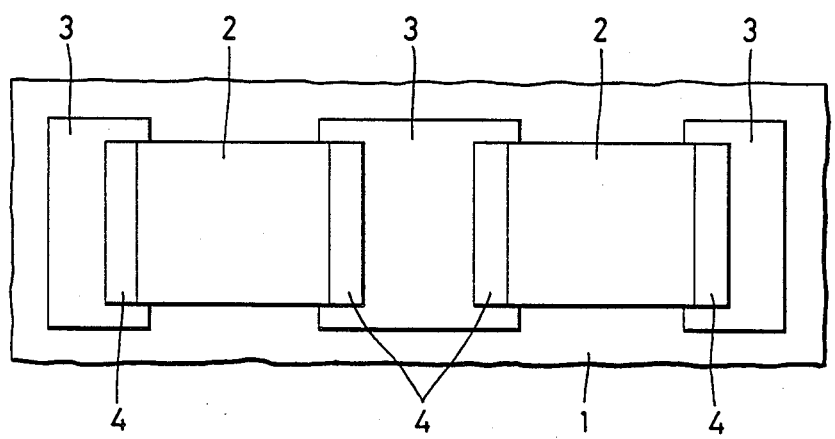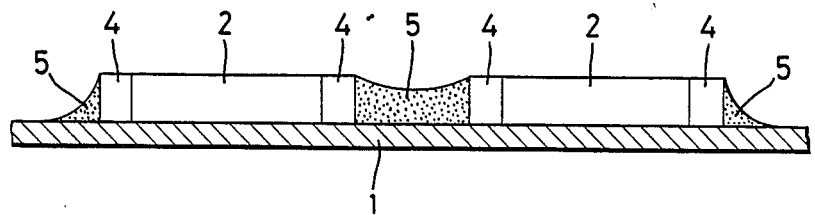

CHIP TYPE COMPONENT INSTALLATION STRUCTURE

BACKGROUND OF THE INVENTION

The invention relates to an electronic chip type component installation structure, and more particularly to a structure for installing chip type electronic components on a printed substrate having fitting patterns by soldering.

For instance, when fitting chip type electronic components such as laminated capacitors and chip resistors on a printed substrate, it is common to use an installation structure that provides a fitting pattern 3 on a printed substrate 1 at a fitting position of an electronic component 2, and fit and fix electrodes 4 of the component 2 to the fitting pattern 3 by solder 5, as shown in FIGS. 10 to 13.

On the installation structure, it was inevitable to use a large quantity of solder 5 in the case of a close arrangement between the chip type electronic component 2 and a chassis 6 as shown in FIGS. 10 and 11 or in the case of a parallel arrangement between plural electronic components 2, 2 as shown in FIGS. 12 and 13.

The thicker the solder layer between the electronic components 2, 2, the bigger the thermal expansion and contraction of the solder. This will thus tend to cause cracks of the electronic component 2 and failure of their soldered portions.

The conventional way to solve these problems was to widen the distance between the electronic component 2 and the chassis 6, or between the adjacent electronic components 2, 2, as shown in FIGS. 14 and 17, corresponding to a widening of the fitting pattern 3, and paint a resist film 7 so as to separate the patterns 3 and reduce the respective solder quantity 5, as shown in FIGS. 14 and 16.

But the problem is such that the band of resist film 7 across and over the fitting pattern 3 causes a lack of solder 5 due to the reduction of the soldering area. This weakens the required fitting strength and the electric connection of electronic component 2. On the contrary, excessive solder may rise upon the resist film 7 and break the insulation of the resist film.

The shortage of solder may also make the soldering impossible due to the lowering polarity of solder 5 between the electrode 4 and the electronic component 2, thus rendering the resumption of soldering necessary.

OBJECTS OF THE INVENTION

It is an object of the present invention to provide a chip type component installation structure which can solve the above noted problem of resist film painting on a fitting pattern.

It is a second object of the present invention to provide a chip type component installation structure which uses an optimum quantity of solder, wherein an excessive amount of solder can be controlled while securing the necessary absolute quantity of solder.

It is a third object of the present invention to provide a chip type component installation structure which can shorten the soldering time while improving the polarity of the solder against the electrodes of the chip components.

It is a fourth object of the present invention to provide a chip type component installation structure which can prevent cracks and breakage of chip components due to the thermal expansion and contraction of solder.

BRIEF DESCRIPTION OF THE DRAWINGS

FIGS. 2 to 9 are plan views of various shapes of resist films processed on fitting patterns;

FIGS. 10 to 17 are plan views and sectional views of conventional installation structures.

DESCRIPTION OF THE PREFERRED EMBODIMENT

Figure 1:
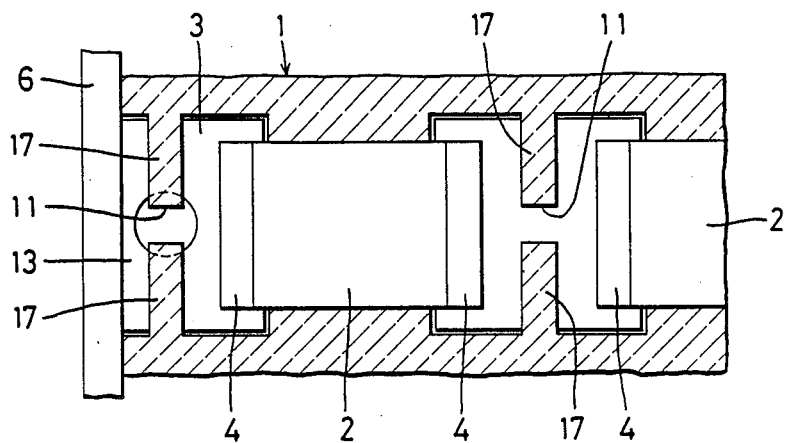
FIG. 1 is a plan view of an installation structure according to the present invention.

Similar symbols are used for similar elements in the example of the invention shown in FIGS. 1 to 9, as in the conventional examples shown in FIGS. 10 to 17.

As shown in FIGS. 1 to 9, a fitting pattern 3 for electronic component 2 is provided on a printed substrate 1, and in a fitting pattern soldering area of the pattern 3 is provided a resist film 17 to reduce the quantity of soldering used to connect component 2 to the fitting pattern 3.

The resist film 17 provides a cut open part 11 on the upper side of the fitting pattern 3. Cut open part 11 thus connects the solder on both sides of the resist film 17 so that the solder is not separated, and connects retains a reasonable quantity of the solder on the fitting pattern. Furthermore, it is possible to control the quantity of the solder by the design of the shape and location of the cut open part 11.

The shape and location of the resist film 17 and the number of cut open parts 11 can be selected freely, as shown in the drawings. Of course, the extent of the resist films 17 and the size of the open part 11 are chosen in conformance with the objects of the invention, i.e. reducing the effect of thermal expansion on the component(s) 2 while still have a sufficient quantity of solder to provide an adequate fitting strength of the solder connection.

Figure 2:
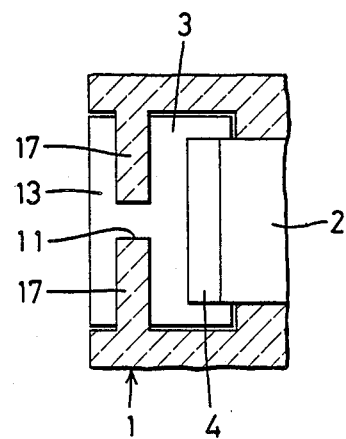
Figure 3:
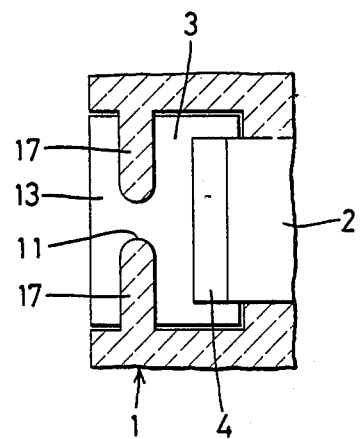
Figure 4:
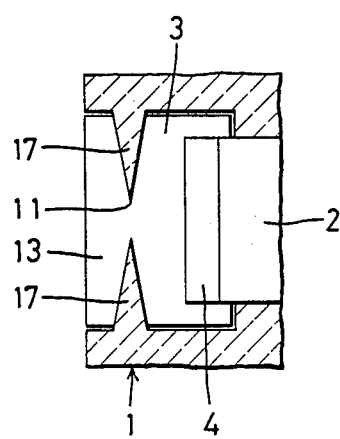

Referring to FIG. 2 the resist film 17 is projected in a straight line from both the sides of the fitting pattern 3 and is cut open at the middle position 11. Referring to FIG. 3, the tips of both resist films 17 are round shaped, and FIG. 4 shown an example having sharpened points.

Figure 5:
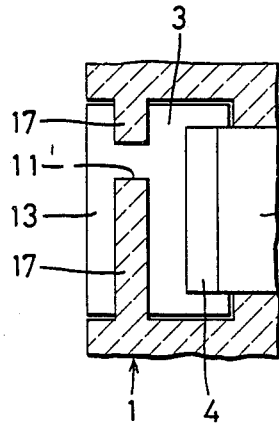
Figure 6:
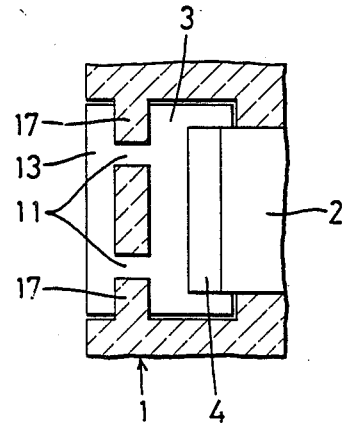

Referring to FIG. 5, cut open part 11 is set to one side of the fitting pattern 3, and FIG. 6 shows an example which provides a cut open part 11 at both sides of the resist film.

Figure 7:
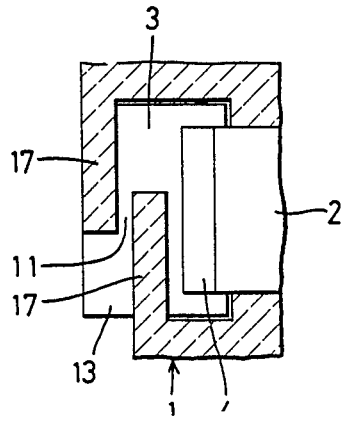
Figure 14:
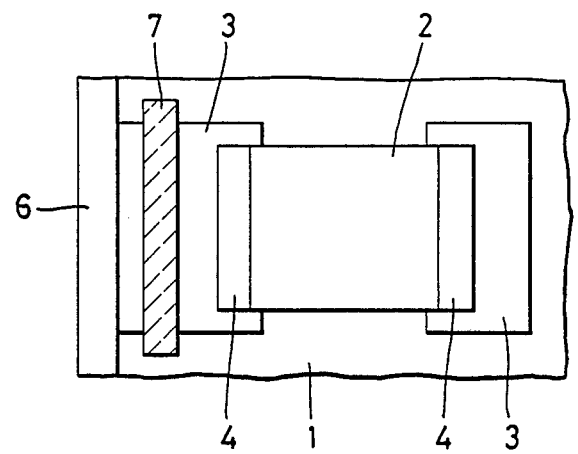
Figure 15:
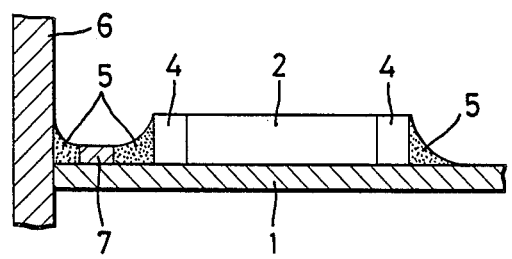
Figure 16:
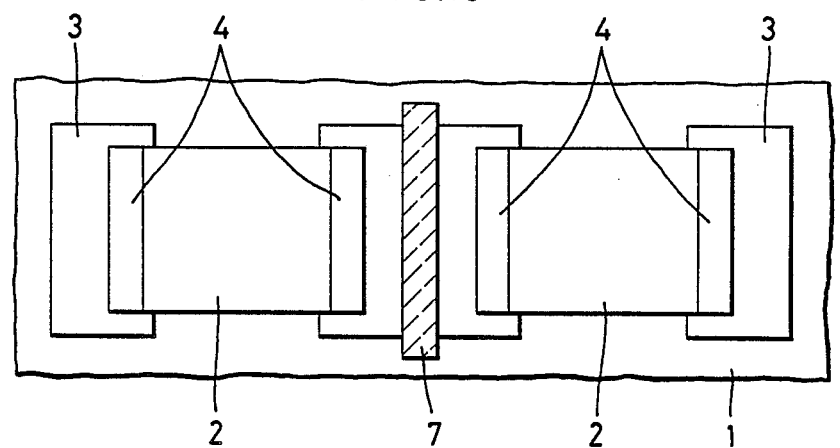
Figure 17:
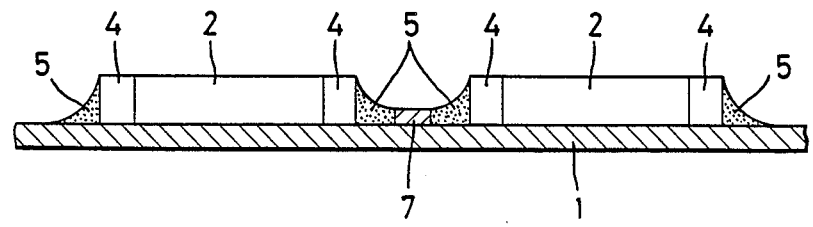

Referring to FIGS. 7 and 8, resist film 17 are on both sides, arranged alternately, i.e. offset with respect to each other, and the cut open part 11 is formed therebetween. FIG. 9 shows an example wherein isolated resist films 17 are set in, or form, cut open parts 11 on the fitting pattern 3.

Referring to FIGS. 2 to 9, separated resist films 17 are set in a lateral direction in the fitting pattern 3. The fitting pattern continues to the outside of resist film 17 into the separated fitting 13.

As mentioned above, when installing the chip type electronic component 2 on the printed substrate 1, the fitting pattern 3 can be soldered to the electrode 4 of the electronic component 2 in a manner rendering it possible to reduce the quantity of solder. This is done by the resist films 17, forming a continuous solder band on both sides of the resist films 17, preventing excess solder, and securing the absolute necessary quantity of solder, by forming the cut open part(s) 11. By continuous is meant that the solder band on both sides is connected and uninterrupted, via the solder in gap 11.

The installation structure provides the cut open part of painted resist films at the fitting pattern on the printed substrate, as a result of which it becomes possible to reduce the solder quantity used for installing the electronic component on the printed substrate, preventing cracks and breakages of the electronic components due to the expansion and contraction of the solder.

Also, the cut open part of the resist films makes it possible to prevent the lack of an absolute quantity of solder, to limit an excessive quantity of solder, to improve the polarity against the electrodes of the electronic components because of non-separation of the solder and to shorten the soldering time.

Resist films are separately provided on the fitting pattern. Therefore, even when electronic components and chassis or two electronic components are more narrowly spaced as compared with conventional fitting structures, space for the electronic components to be applied can be reduced without an excessive quantity of solder.

We claim:

1. A chip type component installation arrangement, comprising:
   a substrate having a fitting pattern;
   a component having an electrode for connection to said fitting pattern of said substrate;
   at least two resist film portions, a first said resist film portion disposed on and extending along said fitting pattern and having opposite lateral sides, and both said resist film portions disposed so as to form a gap therebetween on said fitting pattern;
   a solder connection portion connecting said electrode to said fitting pattern, said solder connection portion disposed along one lateral side of said first resist film portion and extending continuously therefrom through said gap between said resist film portions to the opposite lateral side of said first resist film portion.

2. The chip type component installation arrangement as set forth in claim 1, wherein:
   said first resist film extends from a position laterally outside of the area of said fitting pattern on said substrate linearly into said solder connection portion to a position inside said fitting pattern.

3. The chip type component installation arrangement as set forth in claim 1, wherein:
   said first resist film is completely laterally surrounded by said solder of said solder connection portion.

4. The chip type component installation arrangement as set forth in claim 1, wherein:
   both said resist film portions extend from positions substantially opposite but laterally offset with respect to each other into said solder connection portion.

5. The chip component installation arrangement as set forth in claim 1, wherein:
   both said resist film portions extend from positions opposite each other laterally outside of the area of said fitting pattern toward each other into said solder connection portion to a position inside said fitting pattern, each said resist film portion having an end spaced from the end of the opposite said resist film to form said gap.

6. A chip type component installation arrangement, comprising:
   a substrate;
   a fitting pattern on said substrate, said fitting pattern adapted to be connected to electrodes of a component by soldering, and having a fitting pattern soldering area for connection to the electrode;
   at least two resist film portions, a first said resist film portion disposed on and extending along said fitting pattern and having opposite lateral sides, and both said resist film portions disposed so as to form a gap therebetween on said fitting pattern;
   said soldering area of said fitting pattern comprising an area uncovered by said resist film portions for receiving solder thereon, said area extending continuously along one lateral side of said first resist film portion, from said one lateral side through said gap between said resist film portions, and to the opposite lateral side of said first resist film portion.

* * * * *